(12) United States Patent
Kondo et al.

(10) Patent No.: US 7,826,217 B2
(45) Date of Patent: Nov. 2, 2010

(54) COOLING DEVICE AND ELECTRONIC APPARATUS USING THE SAME

(75) Inventors: Yoshihiro Kondo, Tsuchiura (JP); Akio Idei, Hatano (JP); Shigeyasu Tsubaki, Odawara (JP); Hitoshi Matsushima, Ryugasaki (JP); Tadakatsu Nakajima, Kasumigaura (JP); Hiroyuki Toyoda, Hitachinaka (JP); Tomoo Hayashi, Hitachinaka (JP); Tatsuya Saito, Kunitachi (JP); Takeshi Kato, Akishima (JP); Kenji Ogiro, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 33 days.

(21) Appl. No.: 12/328,967

(22) Filed: Dec. 5, 2008

(65) Prior Publication Data

US 2009/0154104 A1    Jun. 18, 2009

(30) Foreign Application Priority Data

Dec. 14, 2007    (JP)    .............................. 2007-323623

(51) Int. Cl.
*H05K 7/20*    (2006.01)
(52) U.S. Cl. .................. 361/679.53; 361/689; 361/699; 361/700; 165/80.5; 165/104.21
(58) Field of Classification Search ............ 361/679.46, 361/679.47, 679.52, 679.53, 698–701, 709–712, 361/717–727; 165/80.2, 80.4, 80.5, 104.21, 165/104.23, 104.33, 104.34, 185; 62/259.2; 454/184; 257/714; 174/15.2, 16.3, 252
See application file for complete search history.

(56) References Cited

U.S. PATENT DOCUMENTS

| | | | | |
|---|---|---|---|---|
| 5,946,191 A * | 8/1999 | Oyamada | ................. | 361/700 |
| 6,052,885 A * | 4/2000 | Carmien | ................. | 29/428 |
| 6,643,132 B2 * | 11/2003 | Faneuf et al. | ................. | 361/700 |
| 6,657,121 B2 * | 12/2003 | Garner | ................. | 174/16.3 |
| 6,674,643 B2 * | 1/2004 | Centola et al. | ................. | 361/720 |
| 6,693,797 B2 * | 2/2004 | Faneuf et al. | ................. | 361/689 |
| 6,700,785 B2 * | 3/2004 | Berry et al. | ................. | 361/726 |
| 6,776,221 B2 * | 8/2004 | Montgomery et al. | ......... | 165/46 |
| 6,796,372 B2 * | 9/2004 | Bear | ................. | 165/104.21 |
| 6,804,117 B2 * | 10/2004 | Phillips et al. | ................. | 361/700 |

(Continued)

FOREIGN PATENT DOCUMENTS

JP    06-004179    1/1994

(Continued)

*Primary Examiner*—Michael V Datskovskiy
(74) *Attorney, Agent, or Firm*—Antonelli, Terry, Stout & Kraus, LLP.

(57) ABSTRACT

It is an object to provide a cooling device for optimally cooling a semiconductor device on a CPU blade which is detachable with respect to an electronic apparatus using the cooling device with compact structure for reducing power consumption. A cooling device for cooling a semiconductor device disposed on an electronic circuit substrate in a casing of an electronic apparatus, comprising a first cooling unit comprising a first heat absorbing portion and a first heat releasing portion, and a second cooling unit comprising a second heat absorbing portion and a second heat releasing portion, wherein the first heat absorbing portion is disposed in contact with the semiconductor device, the second heat absorbing portion is detachably disposed in contact with the first heat releasing portion, a phase-change refrigerant is contained in the first cooling unit, and the second heat releasing portion is disposed outside the casing.

15 Claims, 4 Drawing Sheets

U.S. PATENT DOCUMENTS

| | | | |
|---|---|---|---|
| 6,828,675 B2 * | 12/2004 | Memory et al. | 257/714 |
| 6,836,407 B2 * | 12/2004 | Faneuf et al. | 361/679.49 |
| 6,927,980 B2 * | 8/2005 | Fukuda et al. | 361/700 |
| 6,972,365 B2 * | 12/2005 | Garner | 174/16.3 |
| 7,012,807 B2 * | 3/2006 | Chu et al. | 361/699 |
| 7,071,408 B2 * | 7/2006 | Garner | 174/16.3 |
| 7,096,928 B2 * | 8/2006 | Phillips et al. | 165/104.21 |
| 7,133,283 B2 * | 11/2006 | Faneuf et al. | 361/689 |
| 7,233,491 B2 * | 6/2007 | Faneuf et al. | 361/689 |
| 7,286,346 B2 * | 10/2007 | Chiba et al. | 361/679.48 |
| 7,403,384 B2 * | 7/2008 | Pflueger | 361/688 |
| 7,428,151 B2 * | 9/2008 | Sonnabend et al. | 361/699 |
| 7,539,020 B2 * | 5/2009 | Chow et al. | 361/726 |
| 7,599,184 B2 * | 10/2009 | Upadhya et al. | 361/699 |
| 7,626,820 B1 * | 12/2009 | Konshak et al. | 361/700 |
| 2006/0013283 A1 * | 1/2006 | Handach | 374/205 |
| 2007/0291452 A1 * | 12/2007 | Gilliland et al. | 361/699 |
| 2008/0225478 A1 * | 9/2008 | Goettert et al. | 361/687 |
| 2009/0027856 A1 * | 1/2009 | McCoy | 361/699 |
| 2009/0080159 A1 * | 3/2009 | Ippoushi et al. | 361/701 |

FOREIGN PATENT DOCUMENTS

| | | |
|---|---|---|
| JP | 07-122869 | 5/1995 |
| JP | 410209660 A * | 8/1998 |
| JP | 2002-374086 | 12/2002 |
| JP | 2007-072635 | 3/2007 |
| JP | 2007-089397 | 4/2007 |

* cited by examiner

# COOLING DEVICE AND ELECTRONIC APPARATUS USING THE SAME

CLAIM OF PRIORITY

The present application claims priority from Japanese patent application Ser. No. 2007-323623, filed on Dec. 14, 2007, the content of which is hereby incorporated by reference into this application.

BACKGROUND OF THE INVENTION

1. Field of the Invention

The present invention relates to a cooling device and an electronic apparatus using the same.

2. Description of Related Art

Recently, a semiconductor device installed in an electronic apparatus such as a computer, that is, a central processing unit (CPU) has its heat release amount increased resulting from higher integration, higher processing speed, and sophisticated structure. Meanwhile, when a temperature of the semiconductor device exceeds a predetermined value, it may fail to maintain its performance, and in the worst case, it may be broken. The semiconductor device which releases higher heat value is required to be subjected to a temperature control through cooling.

A rack mount type electronic apparatus such as a server has been increasingly employed as it allows a system to be flexibly structured to suit user's needs, and the system to be further extended in response to a change in the user's needs. The rack mount type allows individual devices each with different function and performance to be detachably selected and arranged to form the electric apparatus, resulting in a compact system structure.

With the aforementioned background, an electronic circuit substrate (CPU blade) provided with the semiconductor device (CPU) having the heat value increased is mountable on the electronic apparatus (blade server) while exhibiting a cooling function by means of a cooling device having high performance.

With the rack mount type, a liquid cooling system in the blade server is detachable by an auto-shutoff valve for directly cooling heat generated by the semiconductor device in the CPU blade installed in a detachable information processor by a cooling medium via a heat receiving jacket attached to the semiconductor device as disclosed in Document 1 (Japanese Patent Laid-open No. 2002-374086).

Document 2 (Japanese Patent Laid-open No. 2007-72635) discloses a technology which copes with a space occupied by the liquid-cooled system in the electronic apparatus, and provision of an exclusive casing.

Document 3 (Japanese Patent Laid-open No. Hei 07-122869) discloses a socket type thermal connector for thermally connecting an external cooling system with the semiconductor device of the CPU blade for simplifying detachment of the CPU blade.

Document 4 (Japanese Patent Laid-open No. Hei 06-4179) discloses a technology for thermally connecting the external cooling system.

Document 5 (Japanese Patent Laid-open No. 2007-89397) discloses a power converter which is connected to a heat generating portion of the electronic circuit, provided with a stack including a heat pipe for cooling the heat generating portion, and has a stack detachably supported.

With the method for cooling the rack mounted information processor disclosed in Document 1, the cooling medium is supplied from the liquid-cooled system built in a cabinet to a passage in a pillar which constitutes the cabinet, and the passage pipe with a liquid-cooled structure inside the detachable rack is connected via the auto-shutoff valve so as to form the liquid-cooled system. The method allows a direct use of the rack with an air-cooled fan.

A configuration of the liquid-cooled system is limited as it is mounted on the cabinet rack, thus failing to cope with substantial improvement in the system performance. There may be some concern of liquid leakage caused by connection error with the auto-shutoff valve. Description with respect to the increase/decrease in the heat generated by the semiconductor device on the CPU blade, and consideration for a fluctuation is not disclosed in the document.

In the liquid-cooled system disclosed in Document 2, a heat receiving jacket connected to a pipe drawn to outside the electronic apparatus is attached to the semiconductor device of the CPU blade mounted on the electronic apparatus, and the liquid-cooled system is disposed on a door at a back surface of the electronic apparatus to cool a radiator of the liquid-cooled system with a fan inside the electronic apparatus. The liquid-cooled system is intensively arranged on a door at a back surface of the rack, the cooling system may be changed without changing a rack portion.

As the fan in the electronic apparatus is used for cooling the radiator of the liquid-cooled system, the cooling performance is only derived from the fan which is not connected to the liquid-cooled system. As the heat receiving jacket is detachably connected to the liquid-cooled system with a joint, there may be some concern of liquid leakage caused by the connection error likewise Document 1.

The cooling mechanism of the electronic apparatus disclosed in Document 3 is detachably installed together with the CPU blade in the cooling system with the heat pipe attached to the semiconductor device of the CPU blade. The heat pipe is thermally connected to the cooling system with the socket structure having the cooling mechanism attached to the electronic component. This allows the CPU blade to be easily detached and exchanged upon such work as repair and maintenance.

As the cooling system and the electronic apparatus are individually formed in the casings, and integrally connected, the exchange of the cooling system in accordance with the heat generation value of the semiconductor device on the CPU blade is not considered.

In the structure for cooling the semiconductor device on the CPU blade disclosed in Document 4, the CPU blade is combined with the cooling system into a unit so as to be detachably connected to a refrigerant of the external cooling system via the joint. The thus heated refrigerant at the high temperature in the refrigerant cooling device may be heat exchanged with the cooling liquid or the cooling air. However, specific description with respect to a structure of the heat exchanger is not provided, thus failing to provide sufficient cooling performance. As the refrigerant cooling device inside the CPU blade is detachably connected to the external cooling system with the joint, there may be some concern of liquid leakage caused by the connection error likewise the Document 1.

The aforementioned related art has problems to be solved for the purpose of optimally cooling with respect to the heat generated by the semiconductor device of the CPU blade to be attached and detached.

It is an object of the present invention to provide a cooling device for optimally cooling the semiconductor device on the CPU blade which is detachable with respect to the electronic apparatus, and an electronic apparatus using the cooling device with compact structure for reducing power consumption.

SUMMARY OF THE INVENTION

The present invention provides a cooling device for cooling a semiconductor device disposed on an electronic circuit substrate in a casing of an electronic apparatus, comprising a first cooling unit comprising a first heat absorbing portion and a first heat releasing portion, and a second cooling unit comprising a second heat absorbing portion and a second heat releasing portion, wherein the first heat absorbing portion is disposed in contact with the semiconductor device, the second heat absorbing portion is detachably disposed in contact with the first heat releasing portion, a phase-change refrigerant is contained in the first cooling unit, and the second heat releasing portion is disposed outside the casing.

The present invention provides a cooling device for efficiently cooling the semiconductor device on the CPU blade which is detachably mounted on the electronic apparatus at low costs, and an electronic apparatus using the cooling device with a compact structure for reducing power consumption.

The present invention relates to an electronic apparatus (blade server) which allows an electronic circuit substrate (CPU blade) with a semiconductor device (CPU) to be detachably installed, and a cooling device which serves to cool the CPU of the CPU blade.

The cooling device according to the present invention serves to cool the semiconductor device on the CPU blade installed in the electronic apparatus. The CPU blade is structured to be detachably installed inside the casing of the electronic apparatus. The cooling device of the semiconductor device on the CPU blade includes a first cooling unit and a second cooling unit which are separately formed. Each of the first and the second cooling units has a sealed structure which contains the refrigerant. The first cooling unit includes a first heat absorbing portion at one end, which is thermally connected to the semiconductor device of the CPU blade, and a first heat releasing portion at the other end, which is thermally connected to the second cooling unit so as to be detachable with respect to the casing together with the CPU blade as it is detachably installed in the CPU blade. The first heat releasing portion is disposed inside or outside the casing of the electronic apparatus by installing the CPU blade in the electronic apparatus. One of the second cooling units each disposed outside the casing of the electronic apparatus and having different performance is thermally connected to the first heat releasing portion selectively and exclusively.

The first cooling unit has a tubular sealed structure containing the phase-change refrigerant. The refrigerant is vaporized upon reception of heat from the semiconductor device on the CPU blade in the first heat absorbing portion, and thermally connected to the first heat releasing portion. The refrigerant vaporized in the first cooling unit is liquefied through heat absorption by the second cooling unit to transmit heat to the second cooling unit. The second cooling unit is of air-cooled type using the cooling fan and/or liquid-cooled type for circulating the liquid, which may be selected in accordance with the heat generation amount of the semiconductor device of the CPU blade, and thermally connected to the first heat releasing portion.

The second cooling unit that is a liquid-cooled type includes a sealed passage which connects between a thermal connector thermally connected to an outer peripheral wall of the first heat releasing portion and a radiator member for heat release to atmosphere with the pipe such that the liquid is circulated within the sealed passage. The thermal connector has a hollow cylindrical joint structure which encloses the outer peripheral wall of the first heat releasing portion, and has a passage for dividing the inside of the thermal connector into plural sections with plural partitions.

The second cooling unit that is an air-cooled type includes a thermal connector thermally connected to the outer peripheral wall of the first heat releasing portion, a heat sink formed of a fin integrally formed with the thermal connector, and a blower fan.

DETAILED DESCRIPTION OF THE PREFERRED EMBODIMENTS

An embodiment of the present invention will be described referring to the drawings.

Figure 1:
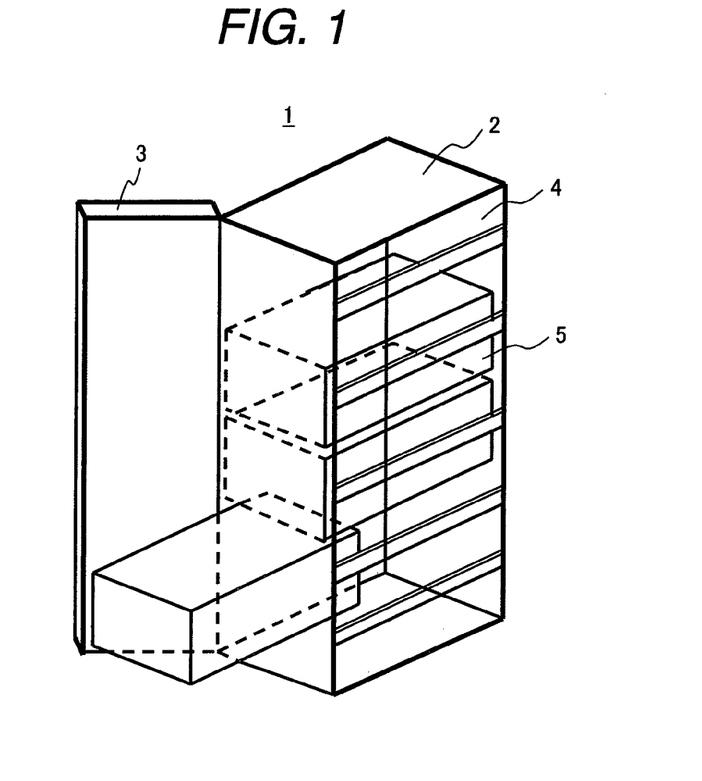
FIG. 1 is a perspective view schematically showing a rack mount type electronic apparatus having a blade server and the like to be installed therein, and a cooling device employed for the electronic apparatus according to the present invention.

FIG. 1 is a perspective view schematically showing a rack mount type electronic apparatus with a blade server and the like, and a cooling device for the electronic apparatus according to the present invention. FIG. 1 is a partially perspective view showing the electronic apparatus for easy understanding. Referring to FIG. 1, a rack mount cabinet 1 includes a casing 2, a lid 3 and a plurality of shelf plates 4 each configured based on a specific standard, for example, IEC (International Electrical Commission) standard and EIA (The Electrical Industries Association) standard. Devices 5 each having a different function may be selectively mounted on those shelf plates 4 in an arbitrary arrangement. The resultant system exhibits both flexibility and extensibility.

Figure 2:
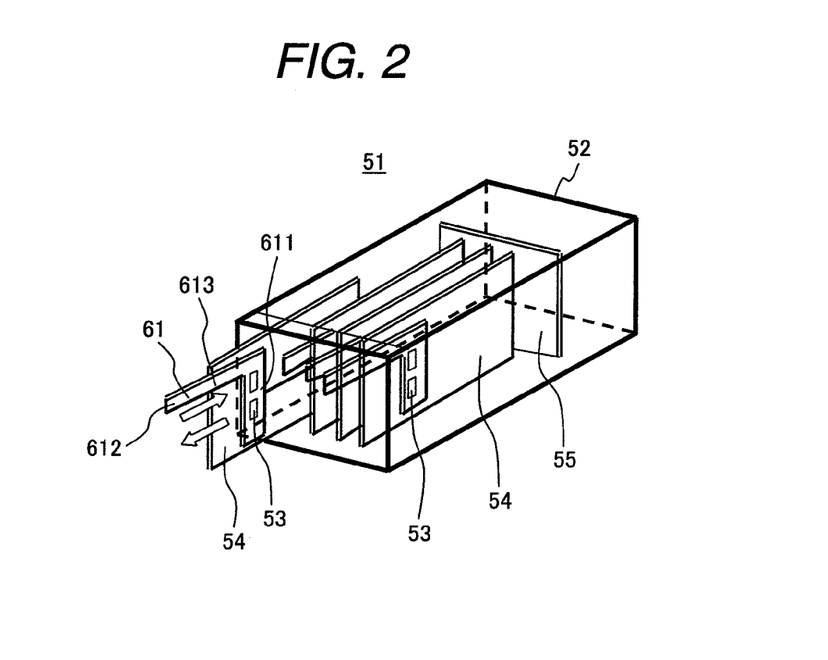
FIG. 2 is a perspective view schematically showing a structure of the blade server according to the present invention.

FIG. 2 is a perspective view schematically showing the structure of the blade server according to the present invention.

Referring to FIG. 2, a blade server 51 includes a plurality of CPU blades 54 each having a CPU 53 mounted thereon, a back plane 55 connected to the plurality of CPU blades 54, and not shown components such as a power module, a switch module, and a management module.

Figure 5:
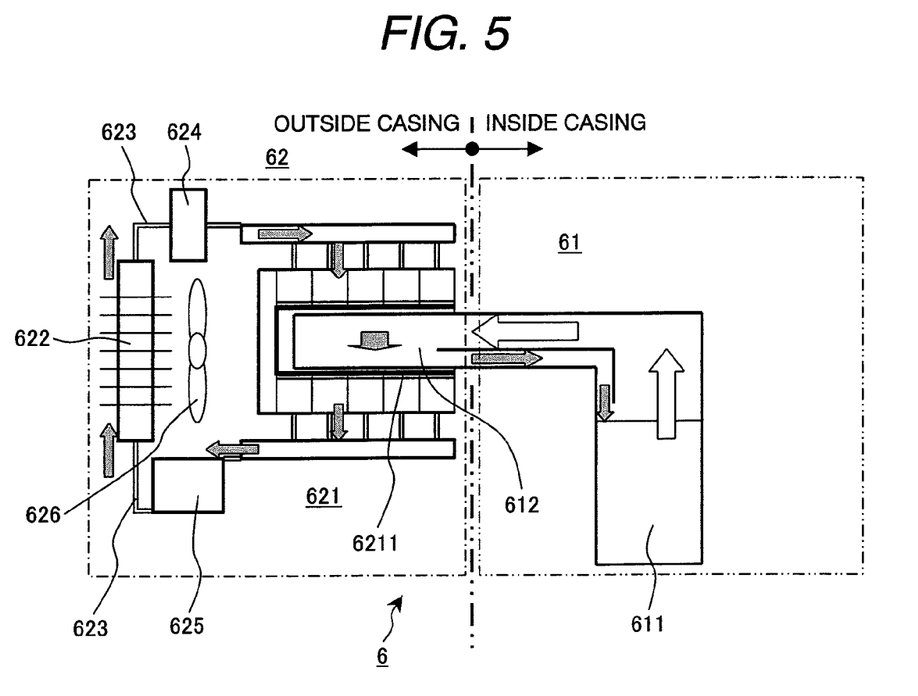
FIG. 5 is a schematic view showing the second cooling unit of the cooling device that is the liquid-cooled type according to the present invention.
Figure 6:
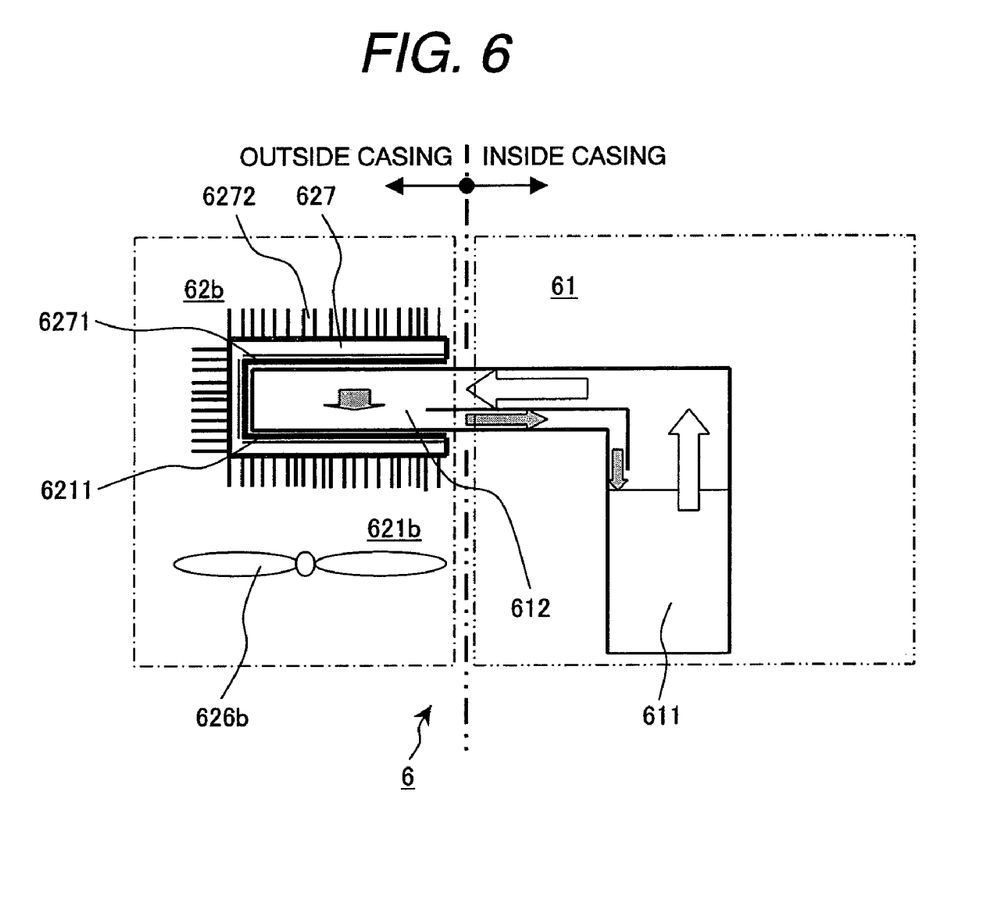
FIG. 6 is a schematic view of the second cooling unit of the cooling device that is the air-cooled type according to the present invention.

Coping with the recent trend of the increase in the number of the devices 5 mounted on the rack mount cabinet 1 accompanied with the high performance and sophisticated electronic apparatus, the number of the shelf plates 4 of the rack mount cabinet 1 on which the devices 5 are mounted is required to be increased. Accordingly, each of the devices 5 to be mounted on the rack mount cabinet 1 is required to be compact, and the space of the cooling device is also required to be minimized. Meanwhile, amount of heat generated by the semiconductor device mounted on the electronic apparatus such as the CPU 53 is increased accompanied with the high performance of the device. The efficient cooling operation has been demanded in the circumstance where the heat generating amount fluctuates depending on the work. For this, the cooling device for the CPU 53 includes a first cooling unit 61 containing the refrigerant and disposed in contact with heat generated by the CPU 53, that is, thermally connected to receive the heat, and a second cooling unit 62 which receives the heat from the first cooling unit 61 to release the heat outside the electronic apparatus. The second cooling unit 62 having the cooling capability changed depending on the cooling mode and the cooling structure is disposed outside the rack mount cabinet 1. The second cooling unit 62 and 62b are shown in FIGS. 5 and 6.

The blade server 51 as one of the devices 5 mounted on the rack mount cabinet 1 having the heat generation amount largely varied depending on the work will be described.

The second cooling unit 62 as a part of the cooling device is disposed outside the electronic apparatus. Meanwhile, the first cooling unit 61 is integrally formed with the CPU blade 54 on which the CPU 53 is mounted even when each of the CPUs 53 generates different amount of heat. A heat absorbing portion 611 of the first cooling unit 61 is thermally connected to the CPU 53. Referring to FIG. 2, the CPU blade 54 is inserted to or removed from the server blade 51 in white arrow directions. Accordingly, the first cooling unit 61 is also inserted or removed together with the CPU blade 54.

In the state where the CPU blade 54 is inserted in the server frame 52, a first heat releasing portion 612 of the first cooling unit 61 is disposed in the vicinity of the inner wall surface of the rack mount cabinet 1, or outside the wall surface. This allows the second cooling unit 62 disposed outside the electronic apparatus to be thermally connected to the first heat releasing portion 612 of the first cooling unit 61 easily to cool the heated CPU 53 mounted on the rack mount cabinet 1.

The first cooling unit 61 shown in FIG. 2 is disposed in the rack mount cabinet 1 at the side of the lid 3. However, it may be disposed in the rack mount cabinet 1 at the opposite side, that is, the side of the casing 2. In either case, the casing 2 or the lid 3 includes an opening for internal or external connection of the cooling device 6, and a dust proof cover member.

Heat reception from the semiconductor device on the CPU blade and transfer of the received heat in the first cooling unit 61 mounted inside the server frame 52 will be described.

Figure 3:
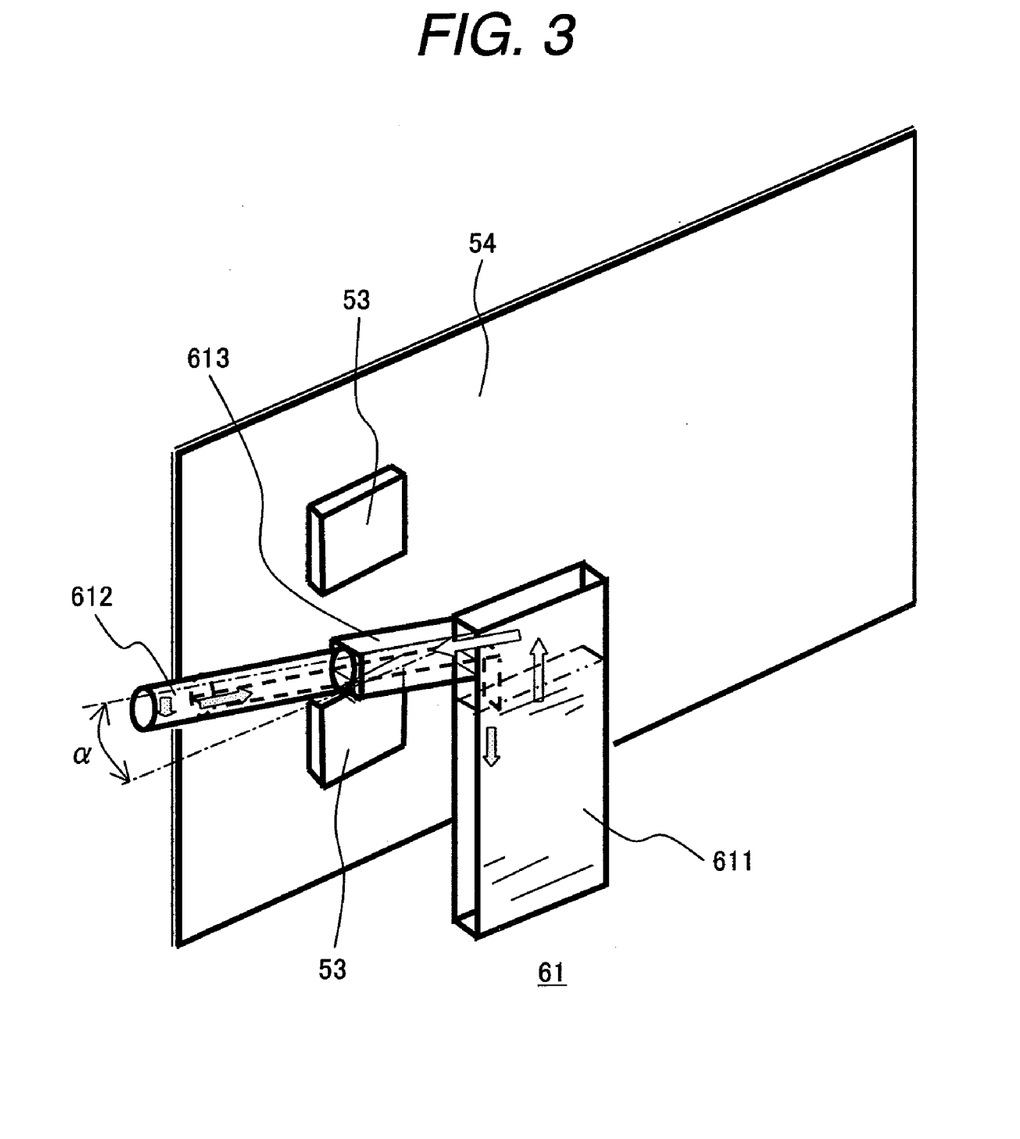
FIG. 3 is a perspective exploded view of a CPU and a first cooling unit thermally connected to the CPU.

FIG. 3 is an explosive perspective view of the CPU and the first cooling unit thermally connected to the CPU. Referring to FIG. 3, the CPU blade 54 has the CPU 53 mounted thereon as the semiconductor device. Any other circuit components mounted on the CPU blade 54 are omitted for simplifying the explanation.

The first heat absorbing portion 611 of the first cooling unit 61 is fixed opposite the CPU 53 via a fixing member (not shown) while suppressing the gap between the CPU 53 and the first heat absorbing portion 611 to improve the thermal connection having the thermal sheet or the heat-sensitive paste (not shown) interposed therebetween. It is preferable to use a thermal metal to form the first heat absorbing portion 611.

In the aforementioned structure, the heat generated by the CPU 53 is transferred to the first heat absorbing portion 611 having the inner space containing the refrigerant. The refrigerant contained in the first heat absorbing portion 611 is vaporized by the heat transferred from the inner wall surface of the first heat absorbing portion 611 such that the heat of the CPU 53 is absorbed by the vaporization heat of the refrigerant. The vaporized refrigerant is transferred upward in the sealed space of the first heat absorbing portion 611 in the white arrow direction. A refrigerant transfer portion 613 is connected to the upper end of the first heat absorbing portion 611. In the embodiment, the inner space of the refrigerant transfer portion 613 is divided with a wall into an upper portion through which the vaporized refrigerant flows and a lower portion through which the refrigerant liquefied in the first heat releasing portion 612 refluxes. The refrigerant transfer portion 613 is diagonally disposed upward at a predetermined angle ($\alpha$) for allowing the refrigerant to easily flow therethrough.

The first heat releasing portion 612 is attached to the leading end of the refrigerant transfer portion 613 for transferring the heat of the vaporized refrigerant to the second cooling unit 62 disposed outside. The second cooling unit 62 thermally connected to the first heat releasing portion 612 absorbs the condensation heat of the refrigerant to be liquefied. The liquefied refrigerant refluxes to the first heat absorbing portion 611 through the lower passage of the refrigerant transfer portion 613 diagonally disposed in the black arrow direction. The refrigerant transfer portion 613 may be positioned straight rather than being diagonally disposed for insertion and removal, and accordingly, the angle $\alpha$ may be set to 0.

The first cooling unit 61 has a sealed space including the first heat absorbing portion 611, the refrigerant transfer portion 613, and the first heat releasing portion 612. No leakage of the refrigerant occurs even if the phase of the refrigerant changes. At least the refrigerant transfer portion 613 has a heat-insulated structure.

Heat transfer between the first cooling unit 61 inside the electronic apparatus and the second cooling unit 62 outside the electronic apparatus will be described.

Figure 4:
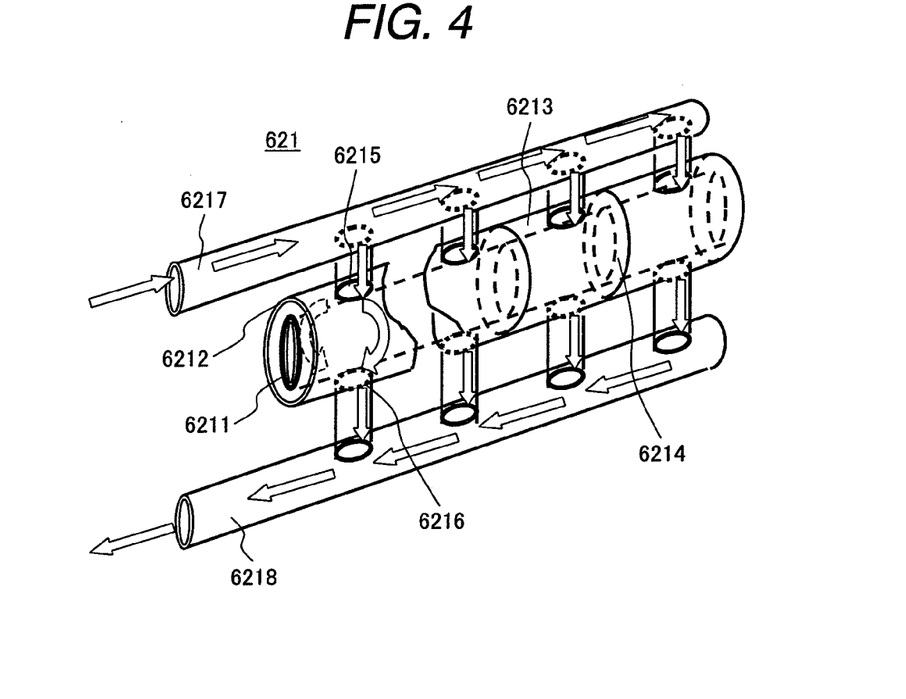
FIG. 4 is a perspective view schematically showing a structure of a thermal connector of a second cooling unit that is a liquid-cooled type according to the present invention.

FIG. 4 is a perspective view schematically showing the structure of the thermal connector in the second cooling unit that is a liquid-cooled type according to the present invention.

A thermal connector 621 of the second cooling unit 62 in FIG. 4 includes a second heat absorbing portion, which is shown as an embodiment of the second cooling unit 62 for circulating the liquid.

The thermal connector 621 of the second cooling unit 62 has a joint structure thermally connected to the outer periphery of the first heat releasing portion 612 of the first cooling unit 61 detachably at an inner peripheral wall 6211 via the heat-sensitive paste or the thermal grease. The heat of the CPU 5 transferred to the first heat releasing portion 612 of the first cooling unit 61 is further transferred to the inner peripheral wall 6211 of the thermal connector 621. The inner peripheral wall 6211 of the thermal connector 621 serves as a second heat absorbing portion of the second cooling unit 62. The heat transferred to the first heat releasing portion 612 by the first cooling unit 61 is transferred to the liquid circulating inside the thermal connector 621 by the second heat absorbing portion. It is preferable to use the member with high heat conductivity, that is, thermal member such as copper and aluminum.

The thermal connector 621 has a tubular sealed space 6213 defined by the inner peripheral wall 6211 and the outer peripheral wall 6212. The sealed space 6213 is divided by a plurality of partitions 6214 such that the liquid flows in the circumferential direction, which includes an inlet 6215 and an outlet 6216 formed in the outer peripheral wall 6212 for each of the divided sections of the sealed space 6213. The inlets 6215 and the outlets 6216 are connected to an inlet pipe 6217 and an outlet pipe 6218 which allow circulation of the liquid. FIG. 4 shows the inlet pipe 6217 and the outlet pipe 6218 each serving as the flow pipe common to the respective inlets 6215 and the outlets 6216 for showing the inlet pipe 6217 and the outlet pipe 6218 in the simplified way. However, they may be formed as exclusive pipes directly connected to the respective inlets 6215 and the outlets 6216.

The liquid flowing from the inlet pipe 6217 passes from the inlet 6215 to the sealed space 6213 in the arrow direction such that heat is transferred to the first heat releasing portion 612 of the first cooing unit 61 on the inner peripheral wall 6211. The liquid having the heat exchanged by the thermal connector 621 has the heat released from the outlet pipe 6218 by the second cooling unit 62 disposed outside the electronic apparatus.

FIG. 5 is a schematic view showing the heat transfer performed by the second cooling unit in the cooling device that is a liquid-cooled type according to the present invention. The second cooling unit 62 using the liquid as shown in FIG. 4 includes the thermal connector 621, and a radiator 622 as the second heat releasing portion for releasing the heat of the liquid heated by the thermal connector 621. The second cooling unit 62 is disposed outside the electronic apparatus formed by connecting a pipe 623 which allows the liquid to circulate in the arrow direction between the thermal connector 621 and the radiator 622, the pump 624 for circulating the liquid, and a tank 625 for filling the liquid in the sealed state. The heat of the liquid is transferred to air blown by the fan 626 by the radiator 622 such that the cooled liquid is circulated in the thermal connector 621. The arbitrary member may be used for circulating the liquid instead of the pump 624. The member for oscillating the liquid to be circulated between the second heat absorbing portion and the second heat releasing portion may be employed. The oscillating member may be formed using the ultrasonic element. In the embodiment, the member for circulating the liquid including the oscillating member will be referred to as the circulating member.

The first cooling unit 61 detachably installed in the electronic apparatus is thermally connected to the second cooling unit 62 disposed outside the electronic apparatus in the space containing the refrigerant and the liquid. This makes it possible to allow the CPU blade 54 to be detachable with respect to the electronic apparatus without leaking the refrigerant and the liquid.

The cooling device 6 is divided into two sections for coping with installation of the CPU blade 54. The second cooling unit 62 with a predetermined cooling capability may be thermally linked from outside the rack mount cabinet 1 in accordance with the amount of heat generated by the CPU 53. Even if the cooling performance of the CPU blade 54 changes after mounting, the second cooling unit 62 is appropriately selected to be joined, which makes it possible to reduce the power consumption and to promote efficiency of the electronic apparatus.

FIG. 6 is a schematic view showing a heat transfer state realized by the second cooling unit in the cooling device that is an air-cooled type according to the present invention. The second cooling unit 62b that is an air-cooled type is used to selectively and exclusively connect the second cooling unit 62 shown in FIG. 5 thermally to the first heat releasing portion 612 of the first cooling unit 61. The term "selectively" denotes to select the second cooling unit which makes sure to establish the predetermined heat release amount, and the term "exclusively" denotes not to use the cooling unit other than the selected second cooling unit.

The thermal connection with the outer periphery of the first heat releasing portion 612 of the first cooling unit 61 is made in the joint structure which allows the thermal connector 621b corresponding to the liquid-cooled thermal connector 621 to be thermally connected detachably via the heat-sensitive paste or the thermal grease. The thermal connector 621b includes a cylindrical heat sink 627 having an inner peripheral wall surface 6271 as the heat transfer surface. The heat sink 627 is provided with fins 6272 on the outer peripheral surface. The heat sink 627 is cooled by air blown by a fan 626b.

The inner peripheral wall portion 6271 of the thermal connector 621b corresponds to the second heat absorbing portion of the second cooling unit 62, and the outer peripheral plane of the heat sink 627 and the fins 6272 constitute the second heat releasing portion. The heat of the CPU 53 transferred to the first heat releasing portion 612 of the first cooling unit 61 on the inner peripheral wall 6271 of the heat sink 627 is further transferred to the cooling air in the heat sink 627 for radiation. It is preferable to use solid metal such as copper and aluminum to form the heat sink 627. A liquid or a solid which changes the phase accompanied with the temperature change may be contained in the heat sink 627. The use of the liquid with less phase change accompanied with the temperature change may physically promote the heat transfer by providing oscillating unit as described referring to FIG. 5.

In the present invention, the type of the second cooling unit may be selected from the liquid-cooled type as shown in FIG. 5, that is, a constitution that the liquid is contained therein to form the circulation mechanism, and the air-cooled type as shown in FIG. 6 in accordance with the heat generation amount of the semiconductor device.

The cooling device 6 is divided into two sections, and the second cooling units 62, 62b each having different cooling performance depending on the configuration and structure are disposed outside the electronic apparatus. The cooling device 6 which is suitable for the heat generation amount of the CPU 53 as the semiconductor device mounted on the CPU blade 54 may be selected. The cooling device with required and sufficient cooling performance for each of the CPU 53 is selected to reduce power consumption, occupied space, and the cost of the electronic apparatus entirely, thus realizing the electronic apparatus with high performance by the use of the highly efficient cooling device 6.

What is claimed is:

1. A cooling system for an electronic apparatus for cooling a semiconductor device on an electronic circuit substrate mounted on the electronic apparatus, wherein the electronic circuit substrate is detachably installed in a casing which forms the electronic apparatus, the cooling system is formed of a heat transfer member and a cooling member which are separately formed, each having a sealed structure which contains a refrigerant, the heat transfer member includes a first heat transfer portion thermally connected to the semiconductor device at one end, and a second heat transfer portion thermally connected to the cooling member at the other end, and is detachable with respect to the casing together with the electronic circuit substrate when the electronic circuit substrate is inserted into or detached from the casing of the electronic circuit substrate, the second heat transfer portion of the heat transfer member is disposed inside or outside the casing of the electronic apparatus by mounting the electronic circuit substrate on the electronic apparatus, the heat transfer member has a sealed tubular configuration containing a phase-change refrigerant, the refrigerant is vaporized by absorbing heat from the semiconductor device for heat reception at the first heat transfer portion, the refrigerant vaporized in the first heat transfer portion of the heat transfer member is liquefied to transfer the heat to the cooling member by absorbing the heat from the thermally connected cooling member at the second heat transfer portion, the cooling member is any one of an air cooling member using a cooling fan and a liquid cooling member for circulating the refrigerant, which is selected in accordance with a heat generation amount of the semiconductor device, and thermally connected at the second heat transfer portion of the heat transfer member to perform heat transfer with the heat transfer member, the liquid cooling member includes a sealed passage which connects between a thermal connector thermally connected to an outer peripheral wall of the second heat transfer portion of the heat transfer member and a radiator as a heat releasing portion with a pipe, the refrigerant being circulated in the sealed passage, the thermal connector has a substantially cylindrical hollow joint structure which encloses an outer peripheral wall of the second heat transfer portion of the heat transfer member, and an inside of the thermal connector is divided into a plurality of passages with a plurality of circular partitions.

2. The cooling system for an electronic apparatus according to claim 1, wherein the air-cooling member includes a thermal connector thermally connected to an outer peripheral wall of the second heat transfer portion of the heat transfer member, a heat sink formed of a fin integrated with the thermal connector, and a fan for blowing air.

3. The cooling system for an electronic apparatus according to claim 1, wherein the cooling member is disposed outside the electronic apparatus, and any one of the air cooling member and the liquid cooling member is selectively and exclusively connected thermally to the second heat transfer portion of the heat transfer member.

4. A cooling device for cooling a semiconductor device disposed on an electronic circuit substrate in a casing of an electronic apparatus, comprising:

a first cooling unit comprising a first heat absorbing portion and a first heat releasing portion; and a second cooling unit comprising a second heat absorbing portion and a second heat releasing portion;

wherein the first heat absorbing portion is disposed in contact with the semiconductor device;

the second heat absorbing portion is detachably disposed in contact with the first heat releasing portion;

wherein a phase-change refrigerant is contained in the first cooling unit;

wherein the second heat releasing portion is disposed outside the casing wherein the second cooling unit includes a thermal connector comprising the second heat absorbing portion, the second cooling unit being selectable between a first constitution that the second cooling unit has the liquid contained therein and the circulating member and a second constitution that the second cooling unit does not have the liquid contained therein and the circulating member, in accordance with a heat generation amount of the semiconductor device; and wherein the thermal connector includes a plurality of partitions for dividing an inner space thereof into a plurality of liquid passages.

5. The cooling device according to claim 4, wherein the refrigerant is a liquid.

6. The cooling device according to claim 5, wherein the refrigerant vaporized by the first heat absorbing portion is liquefied in the first heat releasing portion.

7. The cooling device according to claim 4, wherein the first cooling unit is detachable integrally together with the electronic circuit substrate with respect to the casing upon attachment and detachment of the electronic circuit substrate.

8. The cooling device according to claim 4, wherein the second cooling unit includes a heat sink formed of a solid thermal member.

9. The cooling device according to claim 4, wherein a liquid is contained in the second cooling unit.

10. The cooling device according to claim 9, further comprising a circulating member for circulating the liquid contained in the second cooling unit.

11. The cooling device according to claim 4, wherein a cooling fan is provided for cooling the second heat releasing portion with air.

12. The cooling device according to claim 4, wherein the thermal connector has a hollow joint structure connectable to an outer peripheral wall of the first heat releasing portion.

13. The cooling device according to claim 4, wherein the second cooling unit includes a fin integrally formed with the thermal connector.

14. The cooling device according to claim 4, wherein the second cooling unit is configured so that various cooling performances of the second cooling unit can be exclusively selected.

15. An electronic apparatus comprising the cooling device according to claim 4.

* * * * *